United States Patent
Kang et al.

(10) Patent No.: US 12,270,101 B2
(45) Date of Patent: Apr. 8, 2025

(54) FORMATION OF LITHIUM-METAL-OXYGEN LAYER AND REMOVAL OF LITHIUM CARBONATE ON SOLID STATE ELECTROLYTES

(71) Applicants: UCHICAGO ARGONNE, LLC, Chicago, IL (US); NORTHWESTERN UNIVERSITY, Evanston, IL (US)

(72) Inventors: Donghyeon Kang, Willowbrook, IL (US); Jeffrey W. Elam, Elmhurst, IL (US); Joseph A. Libera, Clarendon Hills, IL (US); Yujia Liang, Lisle, IL (US); HackSung Kim, Naperville, IL (US); Anil U. Mane, Naperville, IL (US)

(73) Assignees: UCHICAGO ARGONNE, LLC, Chicago, IL (US); NORTHWESTERN UNIVERSITY, Evanston, IL (US)

( * ) Notice: Subject to any disclaimer, the term of this patent is extended or adjusted under 35 U.S.C. 154(b) by 1031 days.

(21) Appl. No.: 17/207,445

(22) Filed: Mar. 19, 2021

(65) Prior Publication Data
US 2022/0298626 A1  Sep. 22, 2022

(51) Int. Cl.
C23C 16/18 (2006.01)
C23C 16/455 (2006.01)
H01M 10/0562 (2010.01)

(52) U.S. Cl.
CPC ............ C23C 16/18 (2013.01); C23C 16/455 (2013.01); H01M 10/0562 (2013.01); H01M 2300/0068 (2013.01)

(58) Field of Classification Search
CPC ...... H01M 10/0562; H01M 2300/0068; C23C 16/18; C23C 16/455
See application file for complete search history.

(56) References Cited

U.S. PATENT DOCUMENTS

| | | |
|---|---|---|
| 4,009,052 A | 2/1977 | Whittingham |
| 8,535,832 B2 | 9/2013 | Karthikeyan et al. |
| 8,906,449 B2 | 12/2014 | Li et al. |
| 10,553,874 B2 | 2/2020 | Elam et al. |
| 11,276,879 B2 | 3/2022 | Kim et al. |
| 2004/0072066 A1 | 4/2004 | Cho et al. |
| 2005/0074983 A1 | 4/2005 | Shinriki et al. |
| 2011/0070141 A1 | 3/2011 | Sneh |
| 2012/0301778 A1 | 11/2012 | Trevey et al. |
| 2013/0177808 A1 | 7/2013 | Wang et al. |
| 2013/0333835 A1 | 12/2013 | Carcia et al. |

(Continued)

FOREIGN PATENT DOCUMENTS

| | | | |
|---|---|---|---|
| CN | 111952544 | * | 11/2020 |
| EP | 3 026 738 A1 | | 6/2016 |

(Continued)

OTHER PUBLICATIONS

English translation of CN Publication 111952544, Nov. 2020.*

(Continued)

*Primary Examiner* — Brittany L Raymond
(74) *Attorney, Agent, or Firm* — Foley & Lardner LLP

(57) ABSTRACT

A process for forming a lithium-metal-oxygen film on a lithium SSE. A metal-ligand complex is exposed to the SSE such as for 30-600 seconds in a chemical vapor transfer reactor at a temperature of 200-350° C.

18 Claims, 7 Drawing Sheets

(56) References Cited

U.S. PATENT DOCUMENTS

| | | | |
|---|---|---|---|
| 2013/0337259 A1 | 12/2013 | Carcia et al. | |
| 2014/0008568 A1 | 1/2014 | Fujdala et al. | |
| 2015/0159271 A1 | 6/2015 | Lee et al. | |
| 2015/0180023 A1 | 6/2015 | Xiao et al. | |
| 2015/0357494 A1 | 12/2015 | Dean et al. | |
| 2015/0364747 A1 | 12/2015 | Elam et al. | |
| 2016/0351973 A1 | 12/2016 | Albano et al. | |
| 2017/0263935 A1 | 9/2017 | Kozen et al. | |
| 2017/0338522 A1 | 11/2017 | Hu et al. | |
| 2018/0277830 A1 | 9/2018 | Xing | |
| 2019/0036120 A1 | 1/2019 | Kornbluth et al. | |
| 2019/0044151 A1 | 2/2019 | Elam et al. | |
| 2019/0103231 A1 | 4/2019 | Chai et al. | |
| 2019/0312254 A1 | 10/2019 | Xiao | |
| 2020/0052326 A1 | 2/2020 | Hu et al. | |
| 2020/0075960 A1 | 3/2020 | Wachsman et al. | |
| 2020/0119342 A1 | 4/2020 | Watanabe et al. | |
| 2020/0274138 A1* | 8/2020 | Weimer | C23C 16/30 |
| 2021/0183674 A1* | 6/2021 | McBriarty | C23C 14/046 |
| 2021/0234153 A1 | 7/2021 | Xiao et al. | |
| 2021/0336240 A1 | 10/2021 | Mane et al. | |
| 2021/0359338 A1* | 11/2021 | Duggal | H01M 10/0562 |
| 2022/0298626 A1 | 9/2022 | Kang et al. | |
| 2022/0298633 A1* | 9/2022 | Weimer | C23C 16/45527 |

FOREIGN PATENT DOCUMENTS

| | | | |
|---|---|---|---|
| WO | WO-2016/025866 A1 | 2/2016 | |
| WO | WO-2016/057426 A1 | 4/2016 | |
| WO | WO 2020-257176 | * 12/2020 | |

OTHER PUBLICATIONS

Aurbach, et al., "A short review of failure mechanisms of lithium metal and lithiated graphite anodes in liquid electrolyte solutions," Solid State Ionics 148(3-4), pp. 405-416 (2022).

Aurbach, et al., "The Study of Surface Phenomena Related to Electrochemical Lithium Intercalation into Lix MOy Host Materials (M=Ni, Mn)," Journal of the Electrochemical Society 147(4), pp. 1322-1331 (2000).

Kozen, et al., "Next-Generation Lithium Metal Anode Engineering via Atomic Layer Deposition," ACS Nano 9(6), pp. 5884-5892 (2015).

Shin, et al., "Comparison of Solvent-Cast and Hot-Pressed P(EO)20LIN(SO2CF2CF3)2 Polymer Electrolytes Containing Nanosized SiO2," Journal of the Electrochemical Society 152(2), pp. A283-A288 (2005).

Shin, et al., "PEO-Based Polymer Electrolytes with Ionic Liquids and Their Use in Lithium Metal-Polymer Electrolyte Batteries," Journal of the Electrochemical Society 152(5), pp. A978-A983 (2005).

Whittingham, "Electrical Energy Storage and Intercalation Chemistry," Science 192(4244), pp. 1126-1127 (1976).

Zheng, et al., "Interconnected hollow carbon nanospheres for stable lithium metal anodes, "Nature Nanotechnology 9, pp. 618-623 (2014).

Arnold, et al., "Synthesis of Fluorine-Doped Lithium Argyrodite Solid Electrolytes for Solid-State Lithium Metal Batteries," ACS Applied Materials & Interfaces 14(9), pp. 11483-11492 (2022) (28 page accepted manuscript provided).

Boulineau, et al., "Mechanochemical synthesis of Li-argyrodite Li6PS5X (X=Cl, Br, I) as sulfur-based solid electrolytes for all solid state batteries application," Solid State Ionics 221, pp. 1-5 (2012).

Deiseroth, et al., "Li7PS6 and Li6PS5X (X: Cl, Br, I): Possible Three-dimensional Diffusion Pathways for Lithium Ions and Temperature Dependence of the Ionic Conductivity by Impedance Measurements," Zeitschrift fur anorganische und allgemeine Chemie 637(10), pp. 1287-1294 (2011).

Tokyo Institute of Technology, "Solid electrolytes open doors to solid-state batteries," Phys.org, retrieved from https://phys.org/news/2016-03-solid-electrolytes-doors-solid-state-batteries.html on Sep. 27, 2023, 6 pages (2016).

Yu, et al., "Revealing the relation between the structure, Li-ion conductivity and solid-state battery performance of the argyrodite Li6PS5Br solid electrolyte," Journal of Materials Chemistry A 5(40), pp. 21178-21188 (2017).

Bi, et al., "Stability of Li2CO3 in cathode of lithium ion battery and its influence on electrochemical performance," RSC Advances 6(23), pp. 19233-19237 (2016).

Chen, et al., "Mechanism for Al2O3 Atomic Layer Deposition on LiMn2O4 from In Situ Measurements and Ab Initio Calculations," Chem 4(10), pp. 2418-2435 (2018).

Croy, et al., "Prospects for spinel-stabilized, high-capacity lithium-ion battery cathodes," Journal of Power Sources 334, pp. 213-220 (2016).

Darapaneni, et al., "Elucidating the Redox Behavior during Atomic Layer Deposition on Lithium-Ion Battery Cathode Materials," Chemistry of Materials 33(20), pp. 8079-8088 (2021).

Gutierrez, et al., "Multifunctional Films Deposited by Atomic Layer Deposition for Tailored Interfaces of Electrochemical Systems," Journal of the Electrochemical Society 167(14):140541 (2020) (24 page accepted manuscript provided).

Kang, et al., "Modification of LiMn2O4 surfaces by controlling the Acid-Base surface chemistry of atomic layer deposition," Applied Surface Science 599:153329 (2022) (45 page accepted manuscript provided).

Long, et al., "Advances in Stabilizing 'Layered-Layered' xLi2MnO3 x (1-x)LiMO2 (M=Mn, Ni, Co) Electrodes with a Spinel Component," Journal of the Electro Chemical Society 161(14), pp. A2160-A2167 (2014).

Park, et al., "Ultrathin Lithium-Ion Conducting Coatings for Increased Interfacial Stability in High Voltage Lithium-Ion Batteries," Chemistry of Materials 26(10), pp. 3128-3134 (2014).

Wang, et al., "Synthesis of high capacity cathodes for lithium-ion batteries by morphology-tailored hydroxide co-precipitation," Journal of Power Sources 274, pp. 451-457 (2015).

Young, et al., "High-Rate Spinel LiMn2O4 (LMO) Following Carbonate Removal and Formation of Li-Rich Interface by ALD Treatment," The Journal of Physical Chemistry C 123(39), 23783-23790 (2019).

Han, X., et al., "Negating interfacial impedance in garnet-based solid-state Li metal batteries", Nature Materials, 2017, 16:572-579 (advanced online publication provided; 9 pages).

Julien, C.M., et al., "Functional behavior of AIF3 coatings for high-performance cathode materials for lithium-ion batteries", AIMS Materials Science, 2019, 6(3):406-440.

Lee, Y-G., et al., "High-energy long-cycling all-solid-state lithium metal batteries enabled by silver-carbon composite anodes", Nature Energy, 2020, 5:299-308.

Lin, D., et al., "Reviving the lithium metal anode for high-energy batteries", Nature Nanotechnology, 2017, 12:194-206.

McCloskey, B.D., et al., "Twin Problems of Interfacial Carbonate Formation in Nonaqueous Li—O2 Batteries", The Journal of Physical Chemistry Letters, 2012, 3(8):997-1001.

Talik, E., et al., "Electronic and crystal structure, EPR and magnetic investigations of YF3:1%RE (Re=Pr, Ho, Er and Tm) and LaF3:1% Pr nanocrystals", Journal of Alloys and Compounds, 2014, 616:556-568.

Xu, R., et al., "Artificial Interphases for Highly Stable Lithium Metal Anode", Matter, 2019, 1(2):317-344.

Zhang R., et al., "Coralloid Carbon Fiber-Based Composite Lithium Anode for Robust Lithium Metal Batteries", Joule, 2018, 2(4):764-777.

Zhang, H., et al., "Lithiophilic-lithiophobic gradient interfacial layer for a highly stable lithium metal anode", Nature Communications, 2018, 9:3729, 11 pages.

* cited by examiner

FORMATION OF LITHIUM-METAL-OXYGEN LAYER AND REMOVAL OF LITHIUM CARBONATE ON SOLID STATE ELECTROLYTES

STATEMENT OF GOVERNMENT INTEREST

This invention was made with government support under Contract No. DE-AC02-06CH11357 awarded by the United States Department of Energy to UChicago Argonne, LLC, operator of Argonne National Laboratory. The government has certain rights in the invention.

TECHNICAL FIELD

The present disclosure relates to formation of lithium-metal-oxygen layer.

BACKGROUND

Solid-state batteries ("SSB") are of increasingly widespread use. SSB face a particular challenge in the high interfacial impedance that exists between the solid-state electrolyte ("SSE") and the anode or cathode. Naturally formed lithium carbonate further increases the interfacial impedance. Reducing the impedance through removal of the lithium carbonate and preventing the formation of further lithium carbonate is desirable but not practically achieved.

There have been numerous attempts at addressing the high interfacial impedance in SSBs. One approach has been for removal of lithium carbonate followed by the formation of a protective coating on the SSE. However, such current methods have undesirable attributes, such as being multi-step processes or exhibiting poor scalability to industrial scale use. The multi-step aspect of the existing processes also can allow for formation of lithium carbonate ($Li_2CO_3$) after removal in the first step but before the protective coating can be formed.

The removal of lithium carbonate is typically done by physically stripping off the $Li_2CO_3$ layer using a brush or other physical interactions. This method is not scalable and practical to apply to industrial process. Furthermore, in case of ultra-thin lithium SSEs, physical stripping is not feasible. Therefore, there remains a need for a process for removing lithium carbonate from SSEs and forming lithium metal oxide protective layers on the SSE.

SUMMARY

One embodiment relates to a method, comprising placing a lithium metal structure in a reactor; flowing a metal-ligand precursor vapor in a carrier gas, the precursor comprising a metal selected from Al, In, Ga, and Zn and a ligand selected from the group consisting of an alkyl, through the reactor at a temperature of 250-350° C. for a flow time of 30-600 seconds; and reacting the metal-ligand complex with lithium metal of the lithium SSE, forming a lithium-metal-oxygen film on the lithium SSE.

Another embodiment relates to a method, comprising placing a lithium SSE ("LiSSE") in a reactor, the lithium SSE having an exposed coating of lithium carbonate; flowing a metal-ligand complex precursor vapor in a carrier gas, the precursor comprising a metal selected from Al, In, Ga, and Zn and an alkyl ligand, through the reactor at a temperature of 250-350° C. for a flow time of 30-600 seconds; and reacting the metal-ligand complex with the lithium carbonate of the lithium SSE, removing a portion of the lithium carbonate from the lithium SSE.

This summary is illustrative only and is not intended to be in any way limiting. Other aspects, inventive features, and advantages of the devices or processes described herein will become apparent in the detailed description set forth herein, taken in conjunction with the accompanying figures, wherein like reference numerals refer to like elements.

BRIEF DESCRIPTION OF THE FIGURES

The foregoing and other features of the present disclosure will become more fully apparent from the following description and appended claims, taken in conjunction with the accompanying drawings. Understanding that these drawings depict only several implementations in accordance with the disclosure and are, therefore, not to be considered limiting of its scope, the disclosure will be described with additional specificity and detail through use of the accompanying drawings.

Figure 1A:
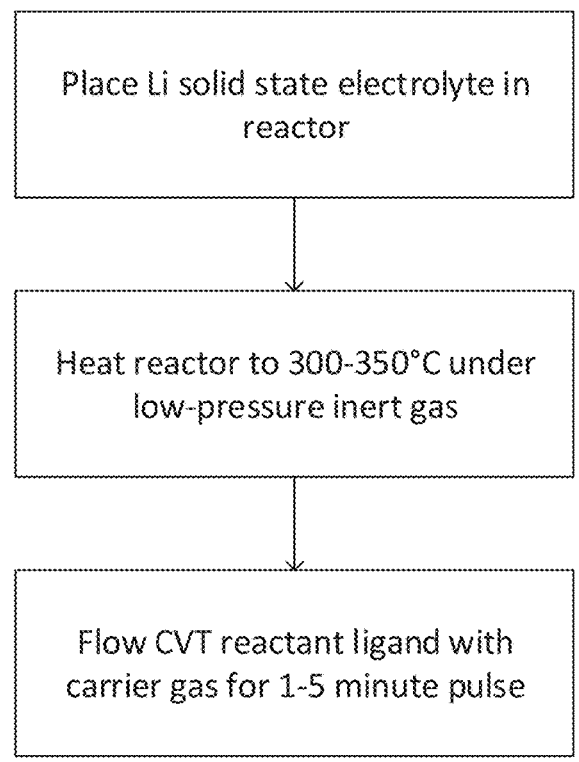
FIG. 1A is a flow chart depicting one embodiment of a process for depositing a lithium-metal-oxygen film.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

Figure 1B:
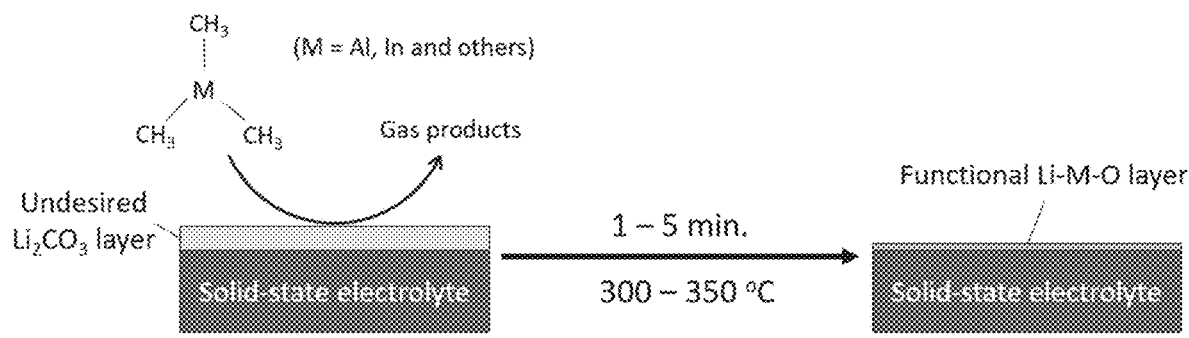
FIG. 1B illustrates a reaction schematic for one embodiment of a process of removing the $Li_2CO_3$ layer and forming a lithium-metal-oxygen ("Li—M—O") layer.

In one embodiment, such as illustrated in FIG. 1A, a process for removal of a deleterious coating and application of a desired protective coating on a lithium solid state electrolyte ("SSE"), such as lithium lanthanum zirconium oxide ("LLZO"), which may be in pellet form or used as the basis for a SSE, is provided. FIG. 1B illustrates a reaction schematic for the process of removing from the SSE the $Li_2CO_3$ layer and forming a lithium-metal-oxygen ("Li—M—O") layer using an metal precursor with metal, M, such as listed below, for example alkylated transition metal precursor. This process is termed chemical vapor treatment ("CVT") and involves the simultaneous etching or removal of material, such as by removal of carbon and oxygen, and the deposition of metal M to form the Li—M—O composite layer. This CVT is distinct from chemical vapor deposition ("CVD") which uses a constant supply of one or more chemical vapors and is purely a deposition process with no etching. CVT is also distinct from atomic layer deposition ("ALD") which uses alternating exposures to two chemical vapors to grow materials via deposition with no etching.

For example, one such process utilizes a low temperature (e.g., 200-350° C.) to remove $Li_2CO_3$ at the surface of lithium metal and apply Li—M—O layer as a single process. FIG. 1A illustrates a general overview of such a process. Notably, the illustrated embodiment use a SSE as the substrate. As a result, such embodiments should be performed below temperatures that will damage the LLZO structure, for example within the temperature range of 25-350° C. Further, in one embodiment, the CVT exposure of the CVT precursor is for 30-600 seconds, such as 40-600, 50-600 seconds, 60-600 seconds, 40-120 seconds, for example 50 seconds. The CVT results in a Li—M—O layer, where M is, for example, Al, In, Ga, and Zn In a first step, a SSE, such as a lithium SSE for use in a lithium metal battery, is positioned in a reactor. The lithium temperature is in between 200-300° C. The heating may, in one embodiment, be under a low pressure (0.05-10 Torr, such as 1 Torr) of an inert gas, with the precursor at a pressure of 0.05-0.5 Torr, such as about 0.1 Torr. The inert gas flow velocity should be in the range of 0.1-20 m/s, or preferably 2 m/s, and will help to sweep away contaminants that desorb from the reactor walls and the SSE. Alternatively, the heating can be performed under high vacuum or ultrahigh vacuum conditions of $10^{-6}$-$10^{-10}$ Torr to avoid contamination of the lithium surface from background impurities, but this can complicate the heating process and increase processing time and equipment costs.

In a next step, a CVT is utilized, with a CVT precursor flowed into the reactor, such as with a carrier gas, for a 45-120 second exposure time of the precursor but preferably about 50 seconds. The precursor partial pressure can be in the range of 0.001-10 Torr but preferably in the range of about 0.1 Torr. Generally speaking, longer exposure times can be used with lower precursor partial pressures, and shorter exposure times can be used with higher precursor partial pressures such that the product of exposure time and partial pressure is approximately 2 Torr seconds.

In one embodiment, the CVT precursor may be selected from the precursors noted below in the forms for the noted example metals in Table 1. Alkyl ligands (e.g., methyl, ethyl, propyl, etc.) are effective in the CVT process. In contrast, alkoxy ligands such as isopropoxy and alkylamido ligands such as dimethylamido are not effective in the CVT process. Precursors having larger alkyl ligands (e.g., tert-butyl) will generally have lower vapor pressures compared to precursors with the same metal but having smaller alkyl ligands (e.g., methyl) and so will require longer CVT processing times relative to precursors with smaller alkyl ligands.

TABLE 1

| Ligand | Metal | | |
|---|---|---|---|
| | Aluminum | Gallium | Indium |
| methyl: $CH_3$ | $Al(CH_3)_3$ | $Ga(CH_3)_3$ | $In(CH_3)_3$ |
| ethyl: $CH_2CH_3$ | $Al(CH_2CH_3)_3$ | $Ga(CH_2CH_3)_3$ | $In(CH_2CH_3)_3$ |
| propyl: $CH_2CH_2CH_3$ | $Al(CH_2CH_2CH_3)_3$ | $Ga(CH_2CH_2CH_3)_3$ | $In(CH_2CH_2CH_3)_3$ |
| isopropyl: $CH(CH_3)_2$ | $Al(CH(CH_3)_2)_3$ | $Ga(CH(CH_3)_2)_3$ | $In(CH(CH_3)_2)_3$ |
| butyl: $CH_2CH_2CH_2CH_3$ | $Al(CH_2CH_2CH_2CH_3)_3$ | $Ga(CH_2CH_2CH_2CH_3)_3$ | $In(CH_2CH_2CH_2CH_3)_3$ |
| isobutyl: $CH_2CH(CH_3)_2$ | $Al(CH_2CH(CH_3)_2)_3$ | $Ga(CH_2CH(CH_3)_2)_3$ | $In(CH_2CH(CH_3)_2)_3$ |
| tert-butyl: $C(CH_3)_3$ | $Al(C(CH_3)_3)_3$ | $Ga(C(CH_3)_3)_3$ | $In(C(CH_3)_3)_3$ |

| Ligand | Metal | |
|---|---|---|
| | Zinc | Cadmium |
| methyl: $CH_3$ | $Zn(CH_3)_3$ | $Cd(CH_3)_2$ |
| ethyl: $CH_2CH_3$ | $Zn(CH_2CH_3)_2$ | $Cd(CH_2CH_3)_2$ |
| propyl: $CH_2CH_2CH_3$ | $Zn(CH_2CH_2CH_3)_2$ | $Cd(CH_2CH_2CH_3)_2$ |
| isopropyl: $CH(CH_3)_2$ | $Zn(CH(CH_3)_2)_2$ | $Cd(CH(CH_3)_2)_2$ |
| butyl: $CH_2CH_2CH_2CH_3$ | $Zn(CH_2CH_2CH_2CH_3)_2$ | $Cd(CH_2CH_2CH_2CH_3)_2$ |
| isobutyl: $CH_2CH(CH_3)_2$ | $Zn(CH_2CH(CH_3)_2)_2$ | $Cd(CH_2CH(CH_3)_2)_2$ |
| tert-butyl: $C(CH_3)_3$ | $Zn(C(CH_3)_3)_2$ | $Cd(C(CH_3)_3)_2$ |

SSE may include a lithium carbonate layer or film, for example a film that has formed upon exposing the SSE to ambient air. The SSE may be prepared by a number of known methods.

The reactor is heated to 100-350° C., such as 200-350° C., 220-320° C., 275-325° C., 280-320° C., or 200-300° C. The reactor may be heated before or after the lithium SSE is loaded into the reactor. The temperature must remain below the melting point of the SSE. The CVT reactions will be slower at lower reactor temperatures adding to the process time. As such, in one embodiment, the preferred reactor While existing methods use physical polishing to remove the lithium carbonate, this has been shown to be less than complete. The describe processes provide a more efficient, controllable and complete method for removal.

In one embodiment, the process may be used to react with the lithium carbonate layer on the lithium SSE. The reaction parameters, including flow, pressure, temperature, and exposure time are selected to remove the lithium carbonate layer. Removal of the lithium carbonate layer is dependent on the amount of lithium carbonate at the lithium metal surface and CVT process time. For example, where the lithium SSE is covered with 80% of $Li_2CO_3$ layer by XPS, at least 30 seconds are required to remove 99% of $Li_2CO_3$ contaminant on the lithium SSE. The lithium SSE is less contaminated by $Li_2CO_3$, the process time is less.

In one embodiment, the process may be used to react with the lithium SSE's surface lithium metal. The reaction parameters, including flow, pressure, temperature, and exposure time are selected to form a lithium-metal-oxygen ("Li—M—O") layer, where the metal originates from the metal precursors used for CVT process. When $Li_2CO_3$-free lithium SSE (pure or "clean" SSE) is used for the CVT process, the metal precursor immediately reacts with lithium metal surface, producing lithium-metal-oxygen layer between 200-350° C.

In a further embodiment, the process maybe be used to remove lithium carbonate and form a lithium-metal-oxygen layer during the same exposure of metal precursors. For example, when the $Li_2CO_3$-contaminated lithium SSE is processed by CVT reaction, the specific metal precursor firstly removes the surface $Li_2CO_3$ contaminant on the lithium SSE. Once the surface $Li_2CO_3$ contaminant is removed, the metal precursor immediately reacts with lithium metal surface, producing a Li—M—O layer.

In one embodiment, a process for removal of $Li_2CO_3$ comprises applying trimethylaluminum ("TMA") for several seconds (depending on the thickness of $Li_2CO_3$) to completely remove surface $Li_2CO_3$ by reaction with TMA. During those exposures, a portion of the TMA reacts with exposed lithium metal and produces Li—Al alloys and Li—Al—C composite layer on the top of lithium metal. As a result, a lithium-aluminum-oxygen ("Li—Al—O") protecting layer is obtained on the top of lithium metal anode.

In one embodiment, the protective Li—M—O layer is a composite layer containing carbon, such up to 10% carbon. The coated lithium metal anode is $Li_2CO_3$-free, stable, and storable for a long time in a controlled atmosphere.

Certain embodiments herein provide, as compared to previous methods: (1) successful removal of $Li_2CO_3$ layer without physical polish, (2) a low-temperature process, (3) a reduced number of process ($Li_2CO_3$-cleaning and surface coating at one time), (4) a fast and scalable process.

Experiments

Example 1

Figures 2A, 2B:
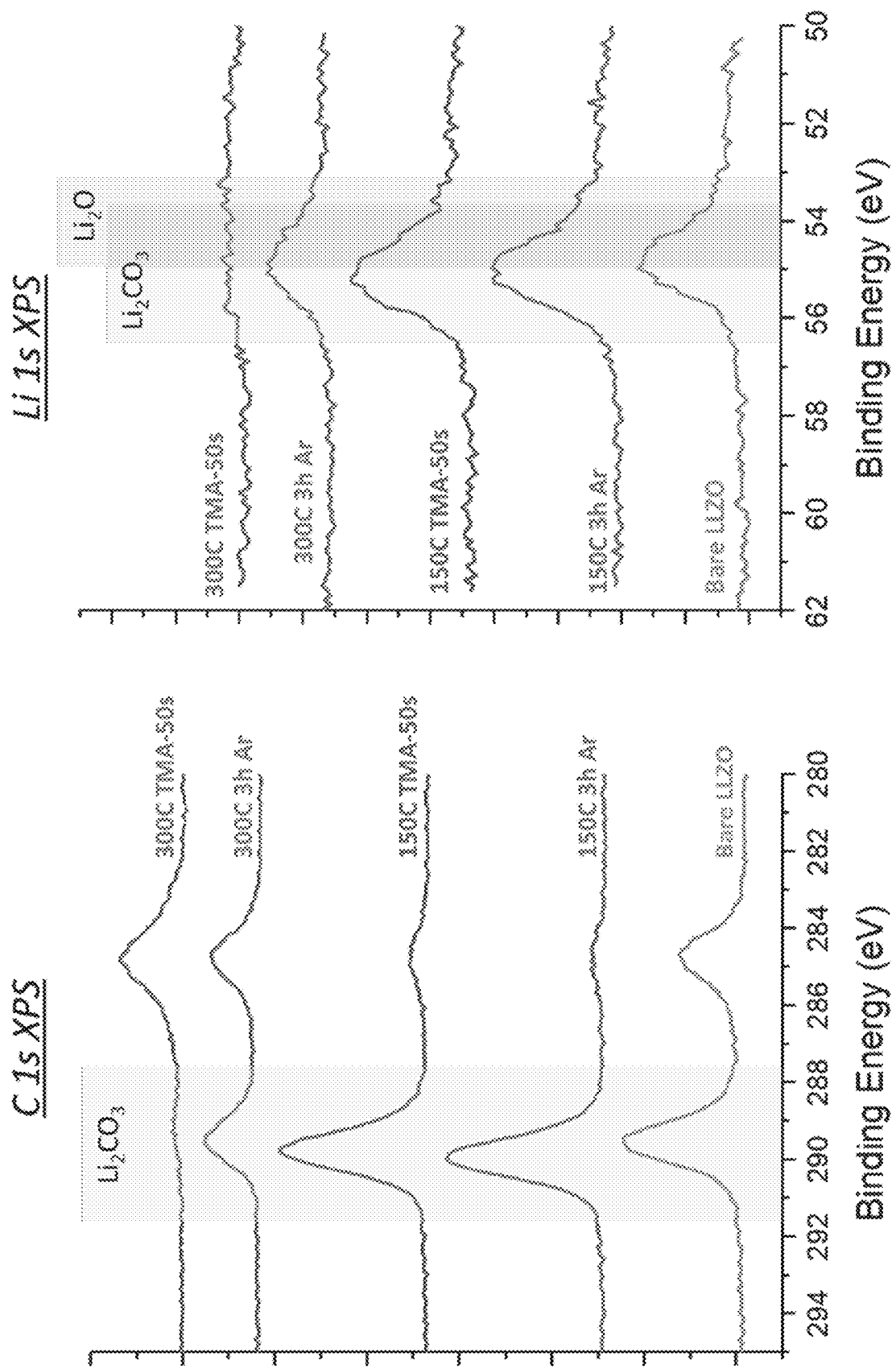
FIGS. 2A-2F are graphs of XPS results for the coated Li-SSE: carbon (FIG. 2A), lithium (FIG. 2B), aluminum (FIG. 2C), oxygen (FIG. 2D), lanthanum (FIG. 2E), and zirconium (FIG. 2F).
Figures 2C, 2D:
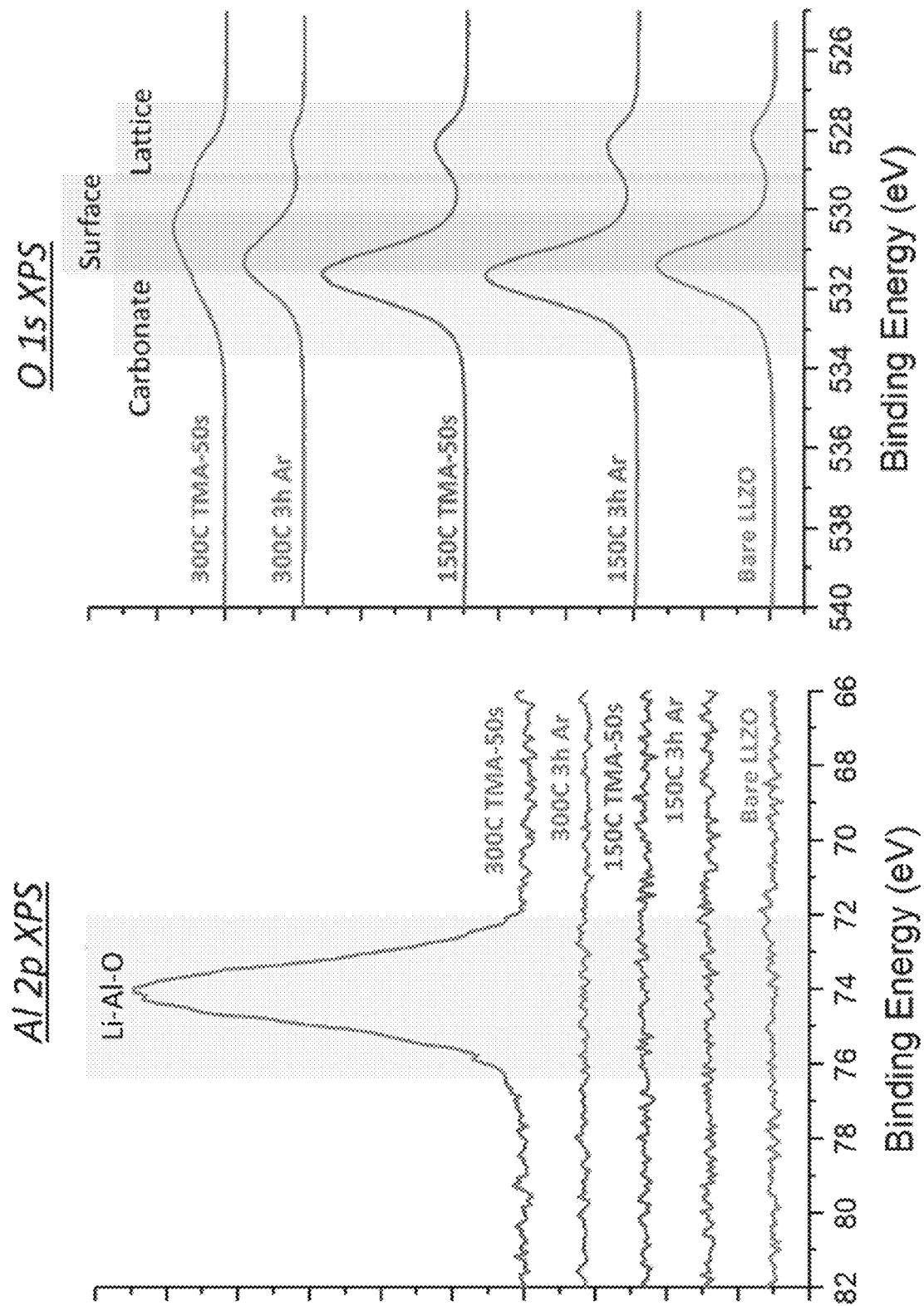
Figures 2E, 2F:
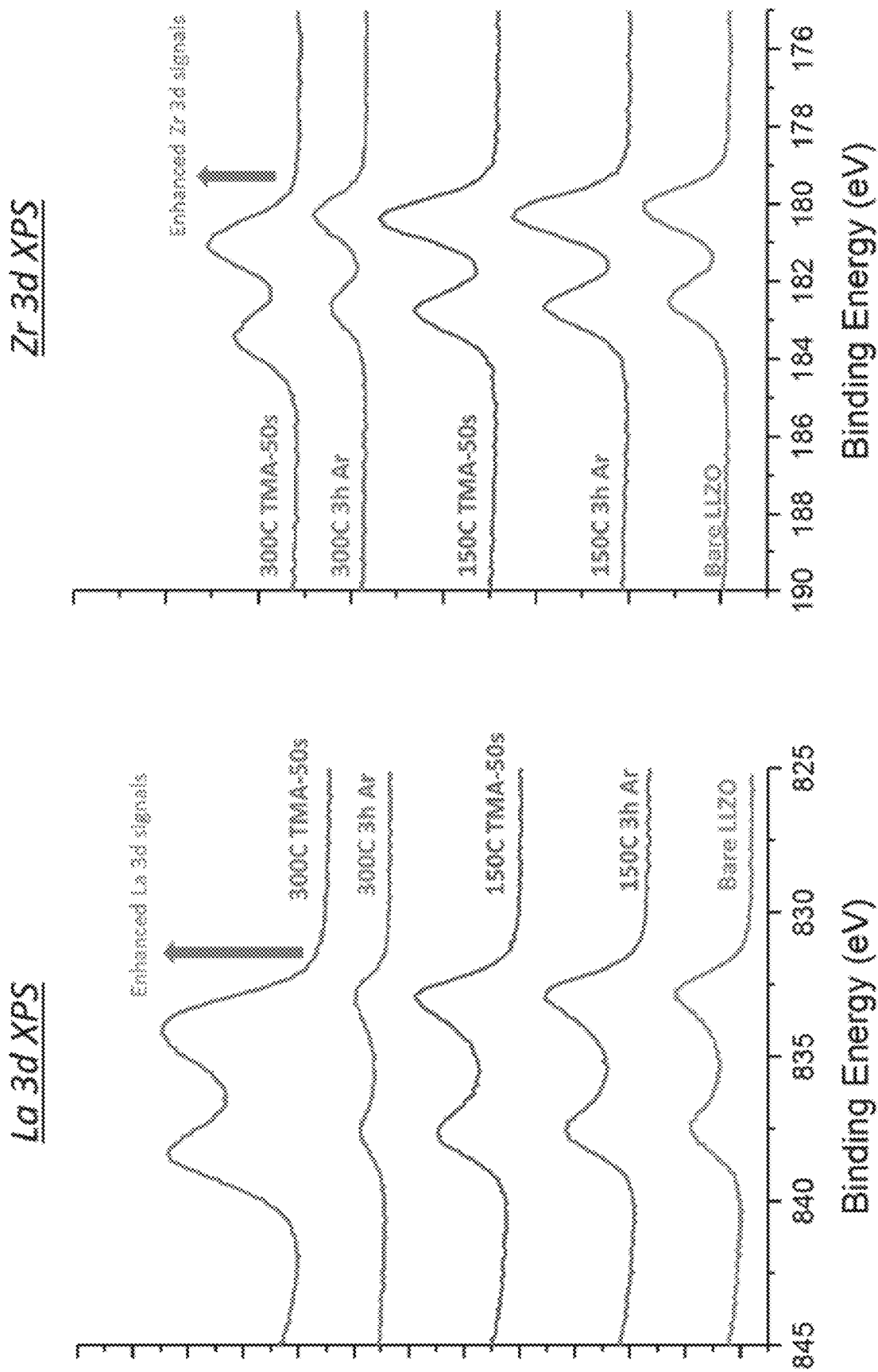

FIGS. 2A-2F show the results of for C1 s XPS comparing bare LLZO, LLZO exposed at 150° C. for 3 hours in Argon, LLZO exposed at 150° C. to TMA for 50 seconds, LLZO at 300° C. for 3 hours in Argon, and LLZO exposed at 300° C. for 50 seconds with TMA, in accordance with one embodiment. FIG. 2B illustrates Li 1 s XPS results for the same five test parameters. FIG. 2C shows the corresponding Al 2p XPS results; FIG. 2D shows the O 1 s XPS results; FIG. 2E shows the La 3d XPS results; FIG. 2F shows the Zr 3d XPS results. As can be seen in the results, the peak associated with the $Li_2CO_3$ is reduced and substantially no longer present in the XPS results, notably the C 1 s results of FIG. 2A. Further, a sharp peak is observed corresponding to Li—Al—O only in the embodiment utilizing exposure of the precursor at 300° C. for 50 s. Merely heating or merely by exposure at a lower temperature with the same precursor (TMA) failed to result in the same remove of $Li_2CO_3$ or formation of a deposited coating (Li—Al—O in this example). Further, it is believed that the $Li_2CO_3$ removal is demonstrated by the results for the La and Zr XPS, which show those elements, suggesting that the $Li_2CO_3$ is not merely buried beneath a layer of deposited material.

Example 2

An experiment was performed to analyze the surface composition of a SSE. For the experiment, a LLZO SSE was exposed in accordance with one embodiment, with TMA flow for 50 s at 300° C. in a reactor. As can be seen in the results of Table 2 below, the Li:La ratio provides an indication of the contamination or lack thereof by $Li_2CO_3$. The Li:La:Zr ratio of LLZO is 7:3:2. As with the examples above and shown in FIGS. 2A-2F, surface analysis for the materials prepared according to one embodiment were compared to a bare LLZO pellet surface, LLZO exposed at 150° C. for 3 hours under an Argon flow, LLZO exposed to a 50 s TMA flow at 150° C., and an LLZO sample exposed to a 300° C. treatment for 3 h under an Argon flow. The results show that only the sample treated at 300° C. with a 50 s precursor exposure demonstrates close to ideal Li:La ratios, indicative of a removal of the contaminating $Li_2CO_3$ coating.

TABLE 2

|  | Atomic % by XPS | | | | | | Li:La:Zr |
| --- | --- | --- | --- | --- | --- | --- | --- |
|  | C | O | Li | La | Zr | Al | Ratio |
| Bare LLZO pellet | 21.55 | 46.96 | 27.30 | 1.78 | 2.50 | — | 27:2:3 |
| 150° C. annealing under Ar for 3 h | 15.56 | 53.78 | 27.62 | 1.27 | 1.77 | — | 28:1:2 |
| 150° C. TMA-50 dose | 15.74 | 53.37 | 27.73 | 1.32 | 1.84 | — | 28:1:2 |
| 300° C. annealing under Ar for 3 h | 21.27 | 44.84 | 29.89 | 1.46 | 2.54 | — | 30:1:3 |
| 300° C. TMA-50 sec | 15.15 | 44.49 | 14.96 | 6.38 | 3.87 | 15.15 | 7.5:3:2 |

Example 3

Figure 3A:
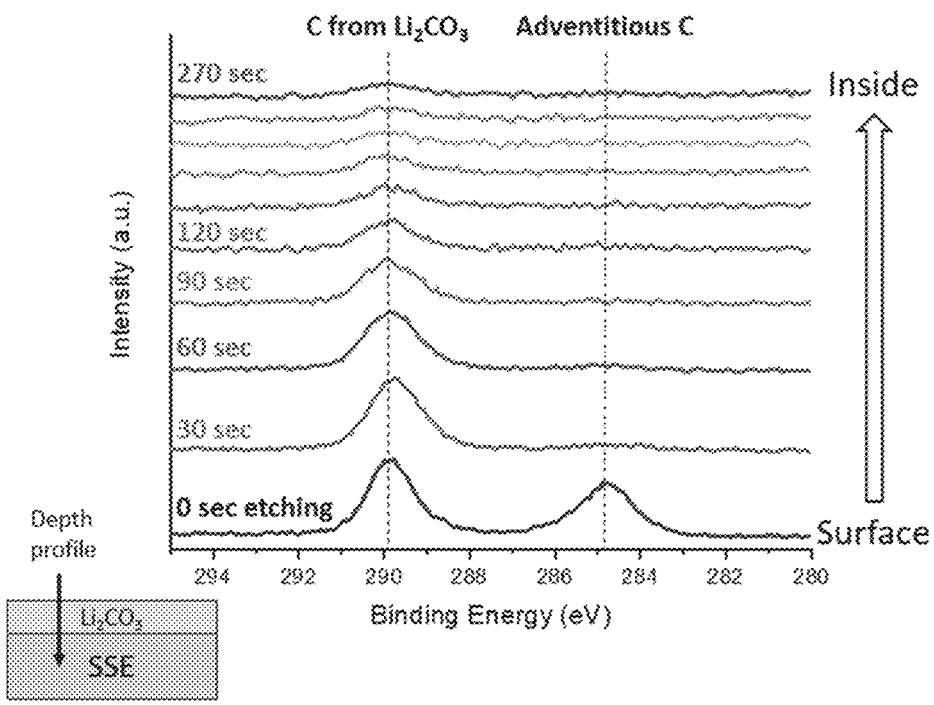
FIG. 3A illustrates a depth profile study (C 1 s) for pristine LLZO.
Figure 3B:
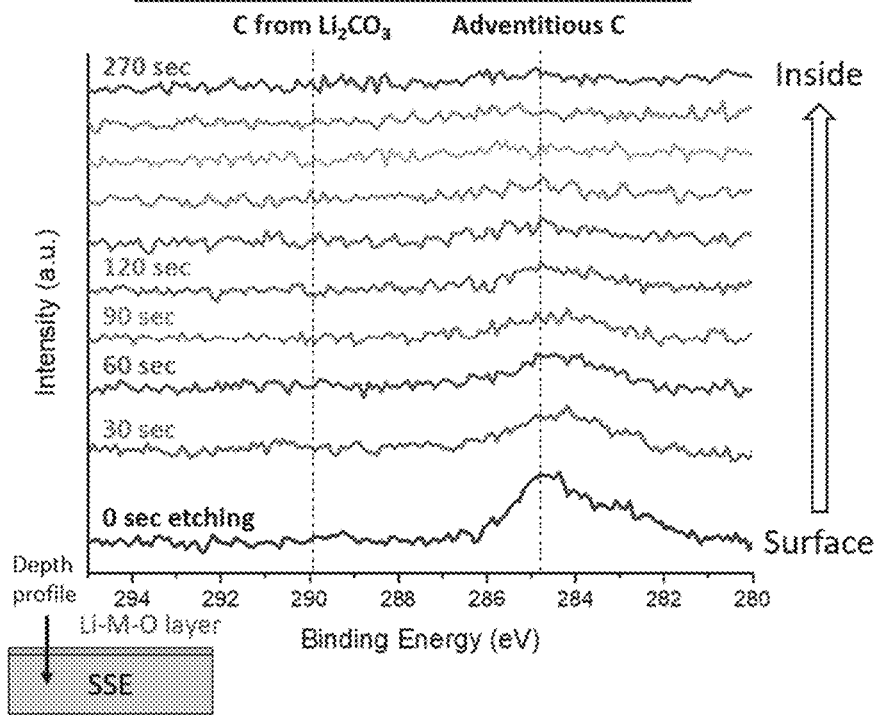
FIG. 3B illustrates a depth profile study (C 1 s) for pristine lithium lanthanum zirconium oxide ("LLZO").

A depth profile study was undertaken to compare a pristine LLZO C1 s depth profile (FIG. 3A) with a depth profile of a LLZO treated by CVT in accordance with one embodiment (FIG. 3B). As can be seen from the results, $Li_2CO_3$ is observed at the surface of the pristine sample while such is not observed in the CVT treated sample. These results confirm that the $Li_2CO_3$ is being removed not buried by CVT deposition materials.

Example 4

Figure 4:
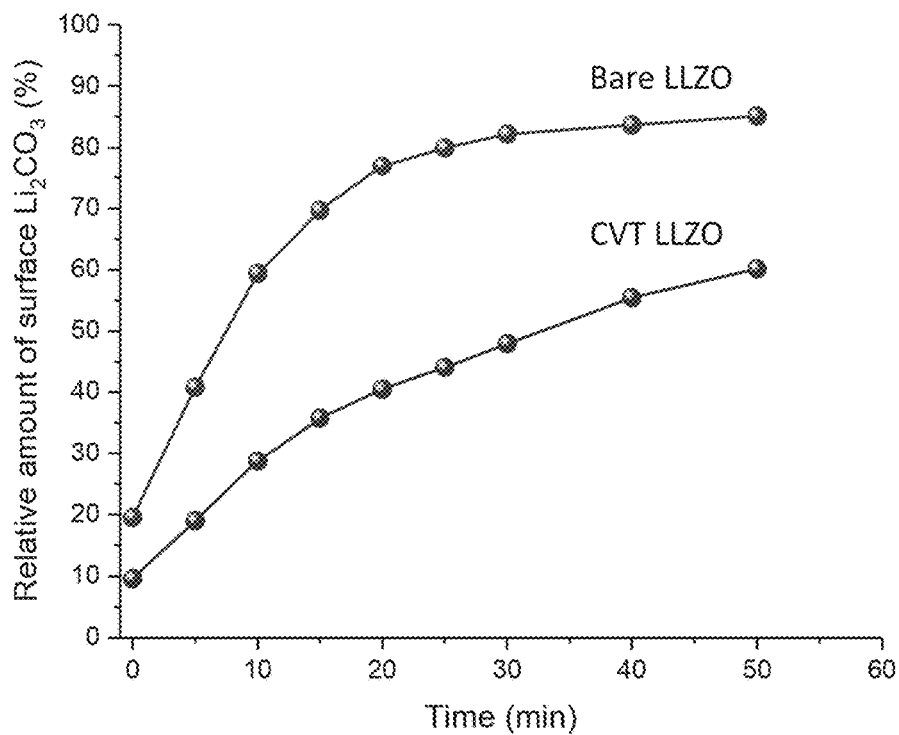
FIG. 4 shows an air stability study, with the graph illustrating formation of $Li_2CO_3$ over time for bare LLZO and for LLZO treated by chemical vapor treatment ("CVT").

An air stability study was undertaking to compare bare LLZO with a sample treated via CVT as described herein. The results shown in FIG. 4 illustrate the formation of $Li_2CO_3$ is slowed notably by the CVT treatment, believed to be due to the deposition of the Li-metal-Oxygen coating.

Example 5

Figure 5A:
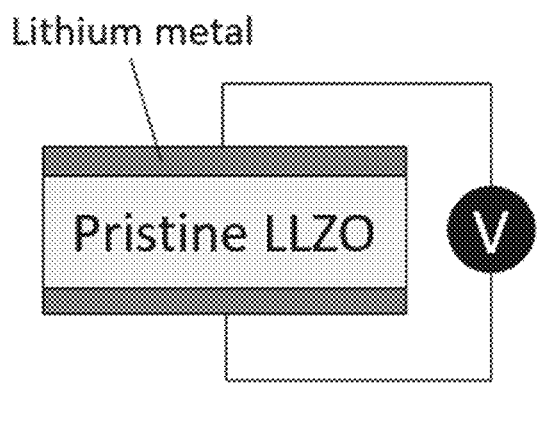
FIG. 5A illustrates a cell structured using a pristine (bare) LLZO electrolyte.
Figure 5B:
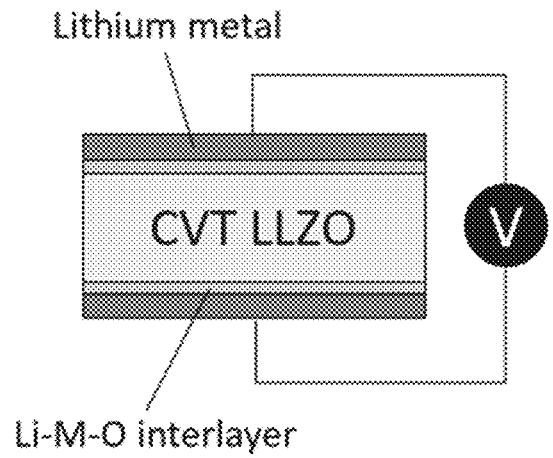
FIG. 5B illustrates a cell structured using a CVT treated LLZO.
Figure 5C:
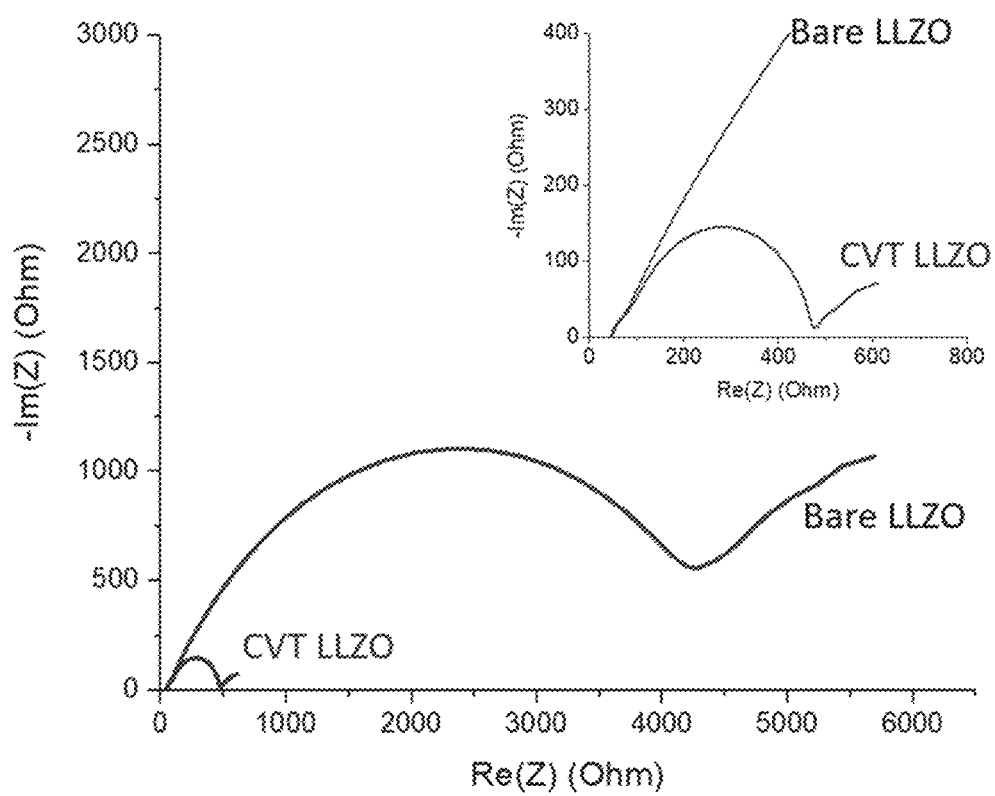
FIG. 5C is a graph illustrating the impedance of the cell using the pristine (bare) LLZO and that of the CVT treated LLZO.

A practical cell structure test was performed using the configuration of a pristine LLZO material as shown in FIG. 5A and compared to the CVT treated LLZO used in the structure of FIG. 5B. FIG. 5C is a graph illustrating the impedance of the cell using the pristine (bare) LLZO and that of the CVT treated LLZO, as can be seen the impedance is reduced, illustrating an interfacial resistance reduction of roughly 90%.

Definitions

No claim element herein is to be construed under the provisions of 35 U.S.C. § 112(f), unless the element is expressly recited using the phrase "means for."

As utilized herein, the terms "approximately," "about," "substantially," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic. For example, circuit A communicably "coupled" to circuit B may signify that the circuit A communicates directly with circuit B (i.e., no intermediary) or communicates indirectly with circuit B (e.g., through one or more intermediaries).

The term "or," as used herein, is used in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is understood to convey that an element may be either X, Y, Z; X and Y; X and Z; Y and Z; or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

References herein to the positions of elements (e.g., "top," "bottom," "above," "below") are merely used to describe the orientation of various elements in the FIGURES. It should be noted that the orientation of various elements may differ according to other exemplary embodiments, and that such variations are intended to be encompassed by the present disclosure.

Although the figures and description may illustrate a specific order of method steps, the order of such steps may differ from what is depicted and described, unless specified differently above. Also, two or more steps may be performed concurrently or with partial concurrence, unless specified differently above.

What is claimed is:

1. A method, comprising:
    placing a lithium metal structure in a reactor;
    flowing a metal-ligand precursor vapor in a carrier gas, the metal-ligand precursor vapor comprising a metal selected from Al, In, Ga, and Zn and a ligand selected from the group consisting of an alkyl, through the reactor at a temperature of 250-350° C. for a continuous flow time of 30-600 seconds; and
    reacting the metal-ligand precursor vapor with lithium metal of the lithium metal structure, forming a lithium-metal-oxygen film on the lithium metal structure.

2. The method of claim 1, wherein the temperature is 280-320° C.

3. The method of claim 2, wherein the carrier gas has a flow velocity of 0.1-20 m/s.

4. The method of claim 2, wherein reacting the metal-ligand precursor vapor with lithium metal is under a high vacuum condition of $10^{-6}$-$10^{-10}$ Torr.

5. The method of claim 1, wherein the metal is aluminum.

6. The method of claim 5, wherein the lithium-metal-oxygen film is a lithium-aluminum-oxygen film.

7. A method, comprising:
    placing a lithium SSE in a reactor, the lithium SSE having an exposed coating of lithium carbonate;
    flowing a metal-ligand complex precursor vapor in a carrier gas, the precursor comprising a metal selected from Al, In, Ga, and Zn and an alkyl ligand, through the reactor at a temperature of 250-350° C. for a continuous flow time of 30-600 seconds; and
    reacting the metal-ligand complex with the lithium carbonate of the lithium SSE, removing a portion of the lithium carbonate from the lithium SSE.

8. The method of claim 7, further comprising forming a lithium-metal-oxygen film on the lithium SSE.

9. The method of claim 8, wherein all of the lithium carbonate is removed from the lithium SSE.

10. The method of claim 8, wherein the temperature is 280-320° C.

11. The method of claim 8, wherein the lithium-metal-oxygen film comprises a lithium-aluminum-oxygen film.

12. The method of claim 11, wherein the metal-ligand complex is trimethylaluminum.

13. The method of claim 7, wherein the carrier gas has a flow velocity of 0.1-20 m/s.

14. The method of claim 7, wherein reacting the metal-ligand complex with lithium metal is under a high vacuum condition of $10^{-6}$-$10^{-10}$ Torr.

15. The method of claim 14, wherein the metal is aluminum.

16. The method of claim 7, wherein the metal-ligand complex is a methyl, ethyl, or propyl ligand.

17. The method of claim 7, wherein the metal-ligand vapor has a partial pressure of 0.001-10 Torr.

18. The method of claim 7, wherein the continuous flow time is 60 seconds to 600 seconds.

* * * * *